US012811349B2

(12) United States Patent
Chui et al.

(10) Patent No.: US 12,811,349 B2
(45) Date of Patent: Nov. 24, 2026

(54) SYSTEM OF CABLE AND CONNECTORS WITH INTEGRATED SENSORS

(71) Applicant: EATON INTELLIGENT POWER LIMITED, Dublin (IE)

(72) Inventors: Galen Chui, Ladera Ranch, CA (US); Mikhail Goykhman, Reseda, CA (US); Alain Philippe, Versailles (FR)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 19/199,036

(22) Filed: May 5, 2025

(65) Prior Publication Data

US 2025/0286326 A1 Sep. 11, 2025

Related U.S. Application Data

(63) Continuation of application No. 17/922,770, filed as application No. PCT/EP2021/025163 on Apr. 29, 2021, now abandoned.

(60) Provisional application No. 63/018,885, filed on May 1, 2020.

(51) Int. Cl.
*H01R 13/66* (2006.01)
*G01R 31/68* (2020.01)

(52) U.S. Cl.
CPC ......... *H01R 13/6683* (2013.01); *G01R 31/68* (2020.01)

(58) Field of Classification Search
CPC ..... H01R 13/6683; G01R 31/68; G01R 31/58
USPC .......................................................... 340/635
See application file for complete search history.

(56) References Cited

U.S. PATENT DOCUMENTS

| | | | | |
|---|---|---|---|---|
| 3,168,906 | A | 2/1965 | Brown | |
| 4,907,630 | A | 3/1990 | Kulikowski et al. | |
| 7,325,569 | B2 | 2/2008 | Denike et al. | |
| 10,116,101 | B2 * | 10/2018 | Huang | H01R 13/6608 |
| 12,074,392 | B2 * | 8/2024 | Jung | H01M 50/211 |
| 2003/0151412 | A1 * | 8/2003 | Gregory | G01R 31/1272 324/536 |

(Continued)

FOREIGN PATENT DOCUMENTS

| | | | |
|---|---|---|---|
| EP | 3001514 | 3/2016 | |
| WO | 2020026057 | 2/2020 | |
| WO | WO-2020026057 A1 * | 2/2020 | H01R 13/6683 |

OTHER PUBLICATIONS

International Search Report and Written Opinion of the International Searching Authority for International Patent Application No. PCT/EP2021/025163 mailed Sep. 28, 2021, 15 pages.

(Continued)

*Primary Examiner* — Omar CasillasHernandez
(74) *Attorney, Agent, or Firm* — Merchant & Gould P.C.

(57) ABSTRACT

An electrical connector assembly includes a first connector member, a second connector member configured for connection with the first connector member, a first insulator disposed at least partially in the first connector member and/or the second connector member, a second insulator disposed at least partially in the first connector member and/or the second connector member, and a circuit board configured to be disposed at least partially between the first insulator and the second insulator in a connected configuration of the electrical connector assembly. The circuit board may include an electrical characteristic sensor and/or a temperature sensor.

20 Claims, 9 Drawing Sheets

(56) References Cited

U.S. PATENT DOCUMENTS

| | | | | |
|---|---|---|---|---|
| 2008/0197312 | A1 | 8/2008 | Brinks | |
| 2009/0251832 | A1 | 10/2009 | Brugner et al. | |
| 2010/0124838 | A1* | 5/2010 | Montena | H01R 24/42 439/578 |
| 2016/0039297 | A1 | 2/2016 | Kretschmer et al. | |
| 2016/0093988 | A1* | 3/2016 | Yue | A41D 1/005 361/103 |
| 2017/0016540 | A1 | 1/2017 | Hartman | |
| 2017/0040752 | A1* | 2/2017 | Lv | H01R 13/6658 |
| 2018/0351307 | A1 | 12/2018 | AbuGhazaleh et al. | |
| 2018/0358760 | A1 | 12/2018 | AbuGhazaleh et al. | |
| 2019/0049533 | A1* | 2/2019 | Popescu | G01R 33/3642 |
| 2020/0238841 | A1* | 7/2020 | Zaki | B60L 53/16 |
| 2021/0050694 | A1* | 2/2021 | Dong | H05K 1/111 |

OTHER PUBLICATIONS

European Office Action for European Patent Application No. 21725028.1 dated Jun. 16, 2025, 9 pages.

* cited by examiner

SYSTEM OF CABLE AND CONNECTORS WITH INTEGRATED SENSORS

CROSS-REFERENCE TO RELATED APPLICATIONS

This application is a Continuation of a patent application Ser. No. 17/922,770, filed Nov. 1, 2022, which is a National Stage Application of PCT/EP2021/025163, filed Apr. 29, 2021, which claims the benefit of U.S. Provisional Application Ser. No. 63/018,885, filed May 1, 2020, the disclosures of which are incorporated herein by reference in their entireties. To the extent appropriate, a claim of priority is made to each of the above disclosed applications.

TECHNICAL FIELD

The present disclosure generally relates to electrical connectors, including electrical connectors that may, for example, be used in connection with aircraft.

BACKGROUND

This background description is set forth below for the purpose of providing context only. Therefore, any aspect of this background description, to the extent that it does not otherwise qualify as prior art, is neither expressly nor impliedly admitted as prior art against the instant disclosure.

Some electrical systems include cables and wires connected via electrical connectors that may not provide sufficient functionality, may be complex, may not be configured for high voltages, may not monitor electrical wiring and interconnection systems (EWIS), and/or may not be efficient. For example, some aircraft electrical systems may include numerous, separate components that may be relatively heavy, large, and/or inefficient.

There is a desire for solutions/options that minimize or eliminate one or more challenges or shortcomings of electrical connectors and systems. The foregoing discussion is intended only to illustrate examples of the present field and is not a disavowal of scope.

SUMMARY

In embodiments, an electrical connector assembly may include a first connector member, a second connector member configured for connection with the first connector member, a first insulator disposed at least partially in the first connector member and/or the second connector member, a second insulator disposed at least partially in the first connector member and/or the second connector member, and/or a circuit board configured to be disposed at least partially between the first insulator and the second insulator in a connected configuration of the electrical connector assembly. The circuit board may include an electrical characteristic sensor and/or a temperature sensor.

With embodiments, An electrical system may include a cable, a first electrical connector assembly connected to a first end of the cable, the first electrical connector assembly including a first electrical characteristic sensor and a first temperature sensor, a second electrical connector assembly connected to a second end of the cable, the second electrical connector assembly including a second electrical characteristic sensor and a second temperature sensor, and an electronic control unit (ECU) connected to the first electrical characteristic sensor, the first temperature sensor, the second electrical characteristic sensor, and the second temperature sensor. The ECU may be configured to determine a leakage current according to a difference between a first current sensed via the first electrical characteristic sensor and a second current sensed via the second electrical characteristic sensor.

In embodiments, a method of operating an electrical system may include sensing an electrical characteristic and/or a temperature associated with a cable via an electrical characteristic sensor and/or a temperature sensor connected to a circuit board of the electrical connector assembly, comparing, via an electronic control unit (ECU), the sensed electrical characteristic and/or temperature with a specified or predetermined range, and/or detecting an error if the sensed electrical characteristic and/or temperature is outside the specified or predetermined range.

The foregoing and other potential aspects, features, details, utilities, and/or advantages of examples/embodiments of the present disclosure will be apparent from reading the following description, and from reviewing the accompanying drawings.

BRIEF DESCRIPTION OF THE DRAWINGS

While the claims are not limited to a specific illustration, an appreciation of various aspects may be gained through a discussion of various examples. The drawings are not necessarily to scale, and certain features may be exaggerated or hidden to better illustrate and explain an innovative aspect of an example. Further, the exemplary illustrations described herein are not exhaustive or otherwise limiting, and are not restricted to the precise form and configuration shown in the drawings or disclosed in the following detailed description. Exemplary illustrations are described in detail by referring to the drawings as follows:

DETAILED DESCRIPTION

Reference will now be made in detail to embodiments of the present disclosure, examples of which are described herein and illustrated in the accompanying drawings. While the present disclosure will be described in conjunction with embodiments and/or examples, they do not limit the present disclosure to these embodiments and/or examples. On the contrary, the present disclosure covers alternatives, modifications, and equivalents.

Figure 1:
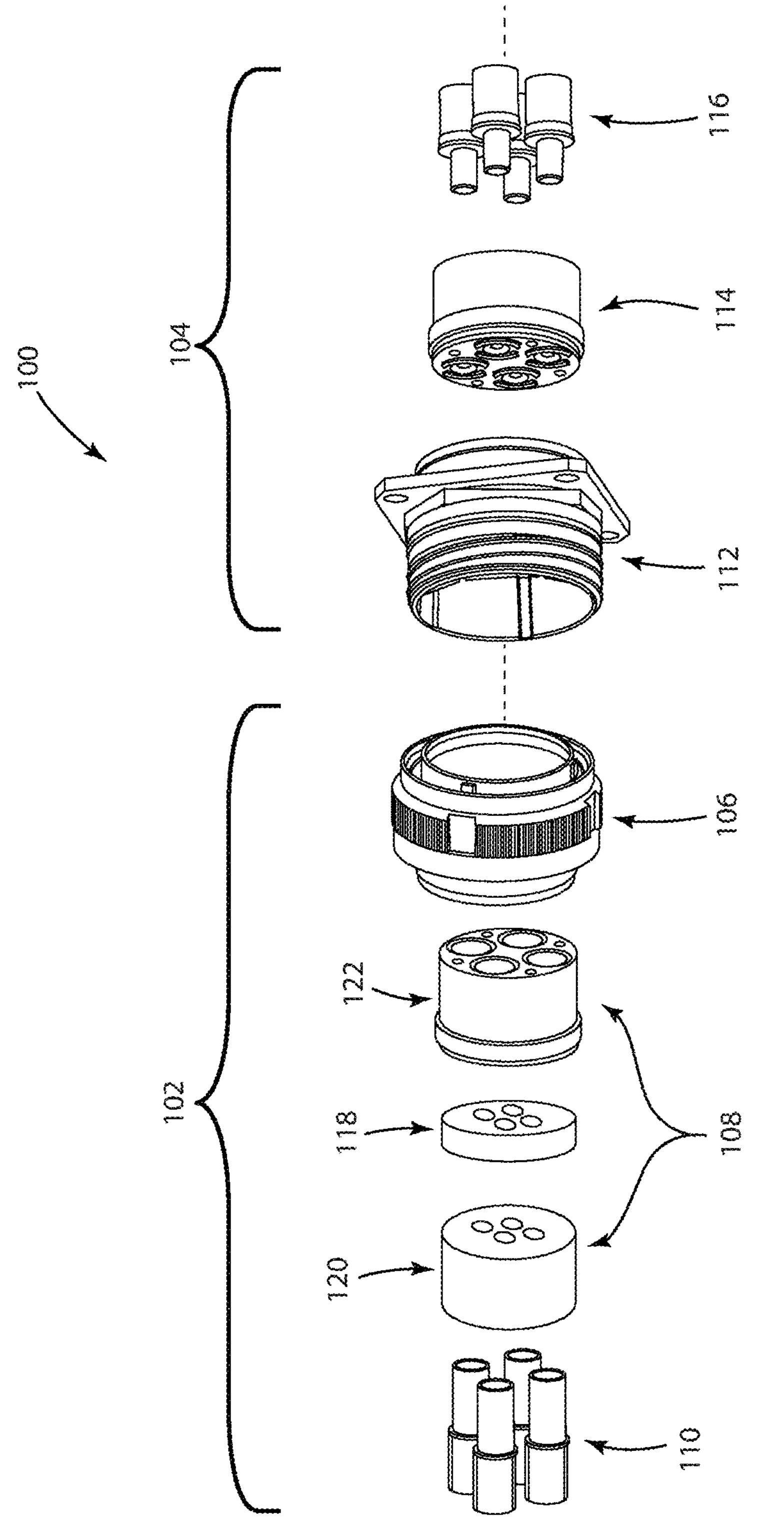
FIG. 1 is an exploded perspective view generally illustrating an embodiment of an electrical connector assembly in accordance with teachings of the present disclosure.

In embodiments, such as generally illustrated in FIG. 1, an electrical connector assembly 100 may include a first connector member 102 and/or a second connector member 104 that may be configured for connection with each other. The first connector member 102 may include a first housing member 106, a first insulator 108, and/or one or more first terminals 110. The second connector member 104 may include a second housing member 112, a second insulator 114, and/or one or more second terminals 116. The first terminals 110 and the second terminals 116 may be configured for connection with each other, such as upon connection of the first connector member 102 with the second connector member 104.

Figure 2:
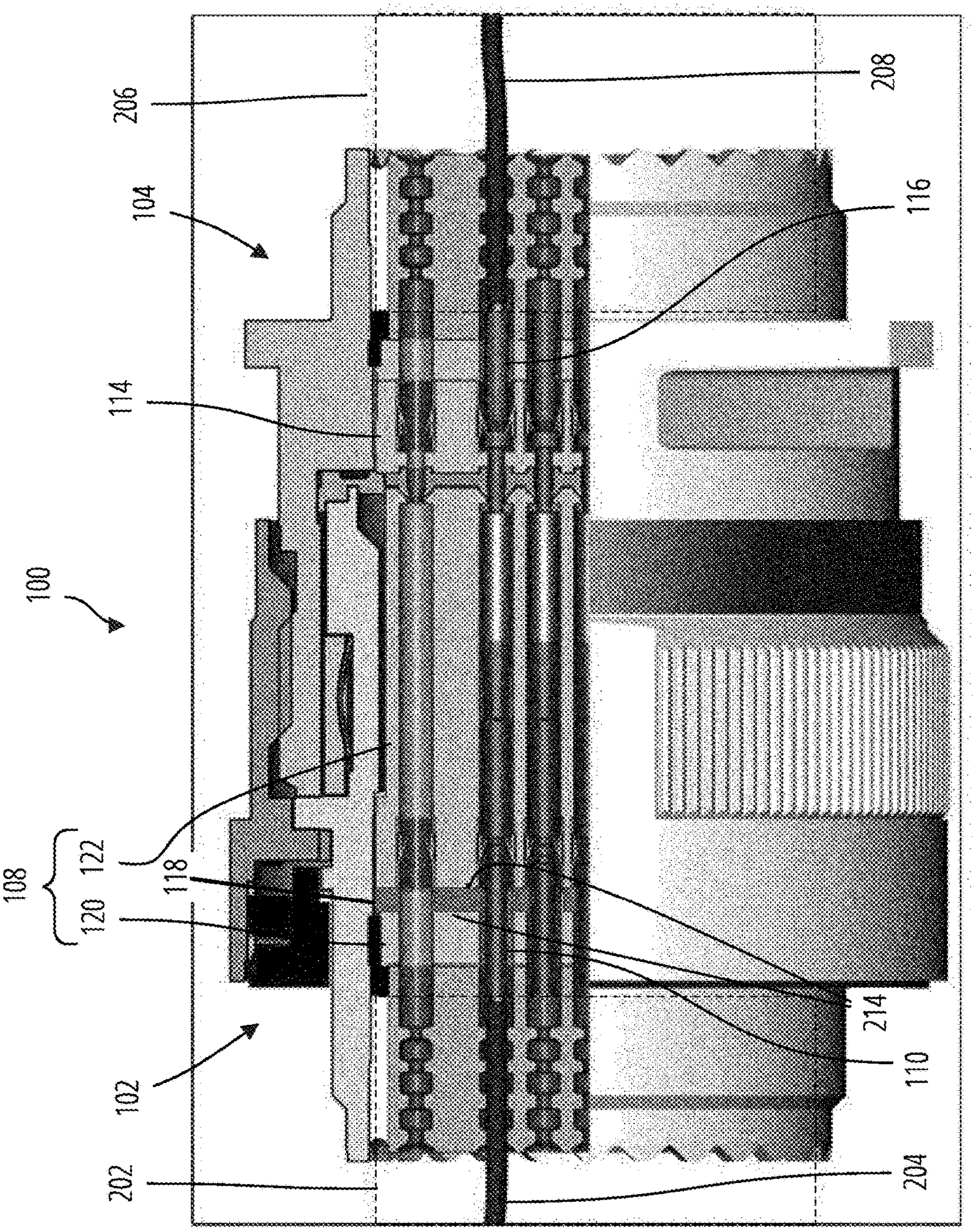
FIG. 2 is a partial cross-sectional view generally illustrating an embodiment of an electrical connector assembly in accordance with teachings of the present disclosure.
Figure 3:
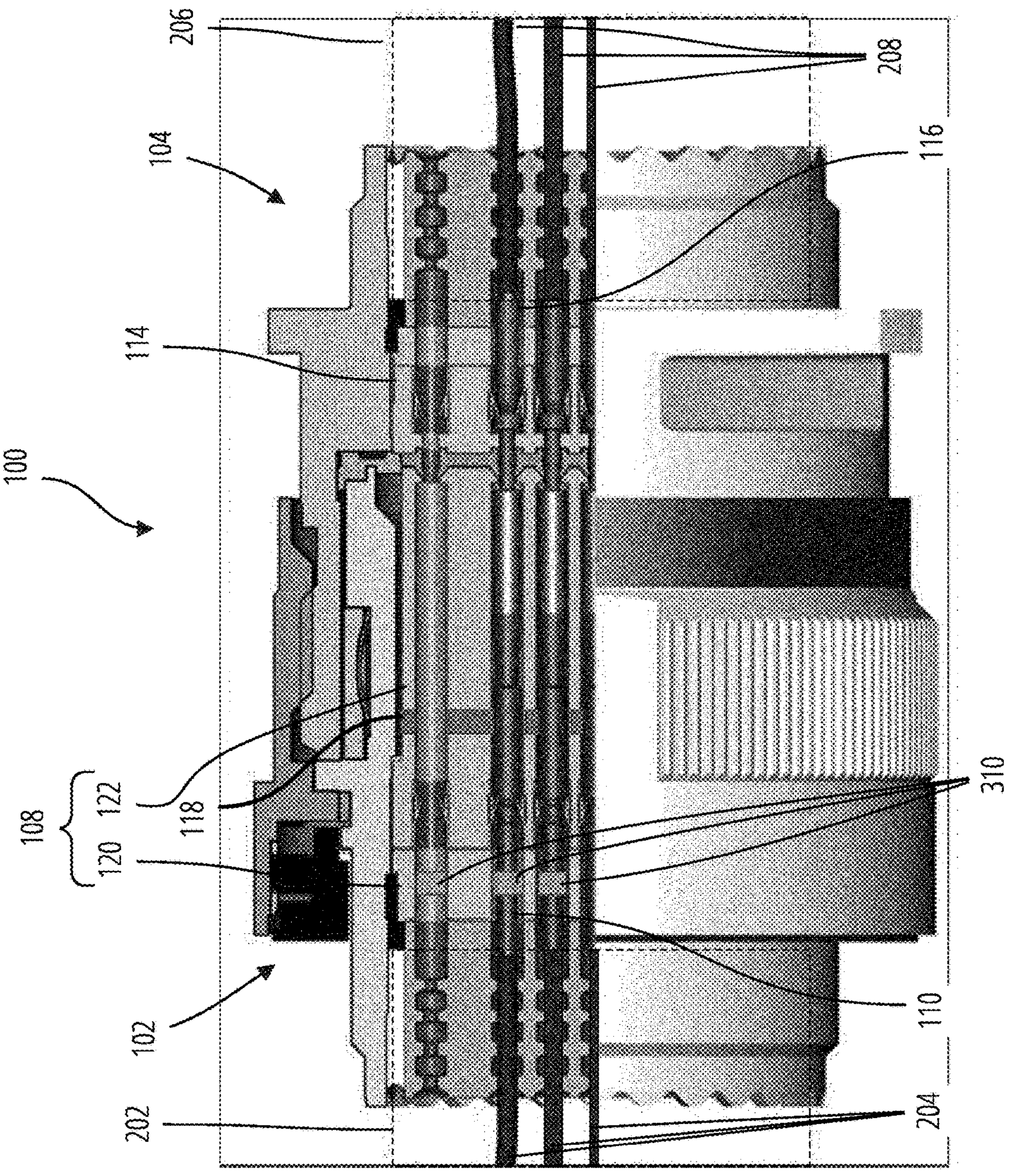
FIG. 3 is a partial cross-sectional view generally illustrating an embodiment of an electrical connector assembly in accordance with teachings of the present disclosure.

With embodiments, such as generally illustrated in FIGS. 2 and 3, an electrical connector assembly 100 may be configured to connect (e.g., electrically) a first cable 202 with a second cable 206. The first cable 202 may include one or more first conductors 204 (e.g., a plurality of first conductors 204). The second cable 206 may include one or more second conductors 208 (e.g., a plurality of second conductors 208). The one or more first terminals 110 may be configured for connection with the one or more first conductors 204. The one or more second terminals 116 may be configured for connection with the one or more second conductors 208. For example and without limitation, connection of the first connector member 102 with the second connector member 104 may connect the first cable 202 with the second cable 206 via the first terminals 110 and the second terminals 116.

In embodiments, such as generally illustrated in FIGS. 1, 2, and 3, an electrical connector assembly 100 may include a circuit board 118. The circuit board 118 may be disposed at least partially in the first connector member 102 and/or the second connector member 104. Additionally or alternatively, the circuit board 118 may be disposed at least partially between (e.g., axially) the first insulator 108 and the second insulator 114. In some circumstances, the first insulator 108 may include a first portion 120 and/or a second portion 122 that may be spaced and/or separate from the first portion 120. The second portion 122 may be disposed at least partially between (e.g., axially) the first portion 120 and the second insulator 114, such as in a connected configuration of the electrical connector assembly 100 (see, e.g., FIG. 2). The circuit board 118 may be disposed at least partially between the first portion 120 and the second portion 122. For example and without limitation, the circuit board 118 and the second portion 122 may be disposed at least partially between the first portion 120 and the second insulator 114. With embodiments, such as generally illustrated in FIG. 3, the circuit board 118 may be disposed such that the circuit board 118 is disposed radially within portions of the first connector member 102 and the second connector member 104.

Figure 4:
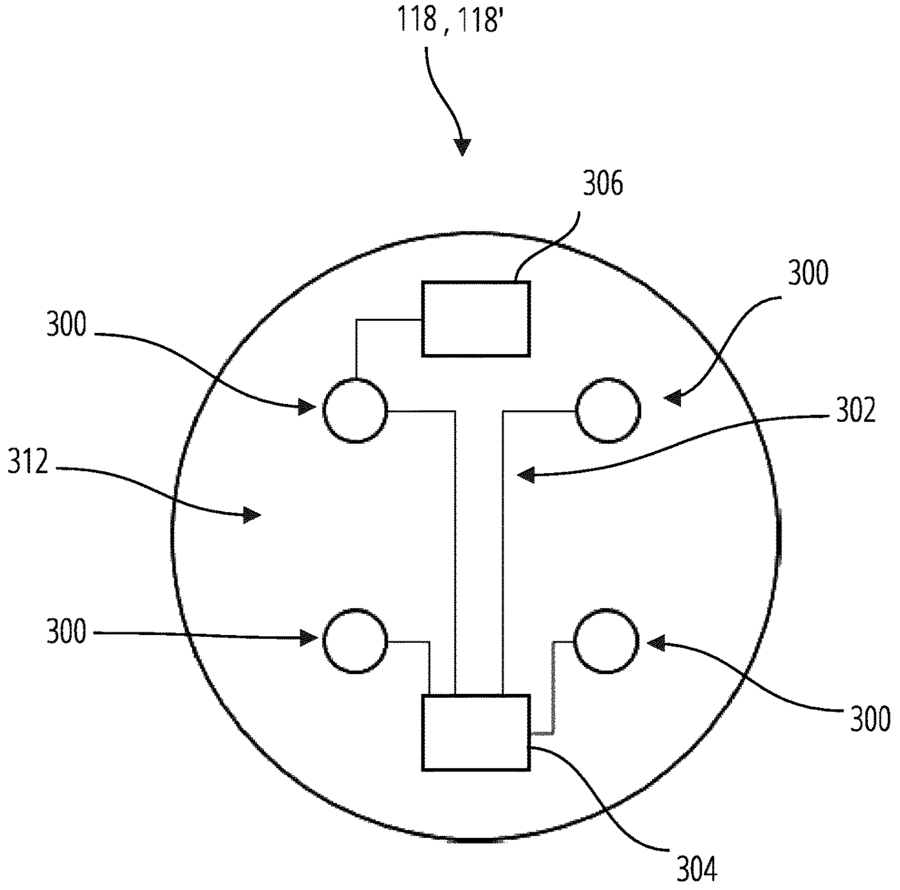
FIG. 4 is a top view generally illustrating an embodiment of a circuit board in accordance with teachings of the present disclosure.
Figure 5:
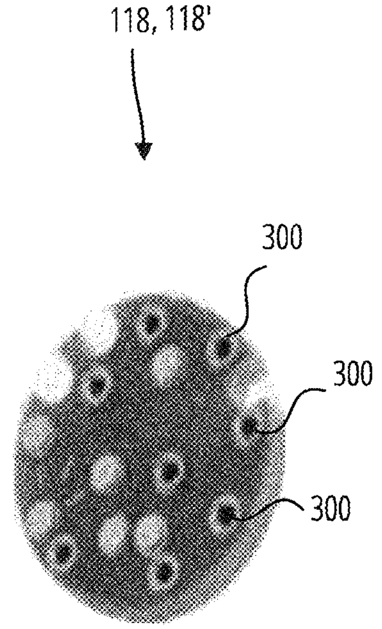
FIG. 5 is a perspective view generally illustrating an embodiment of a circuit board in accordance with teachings of the present disclosure.
Figure 6:
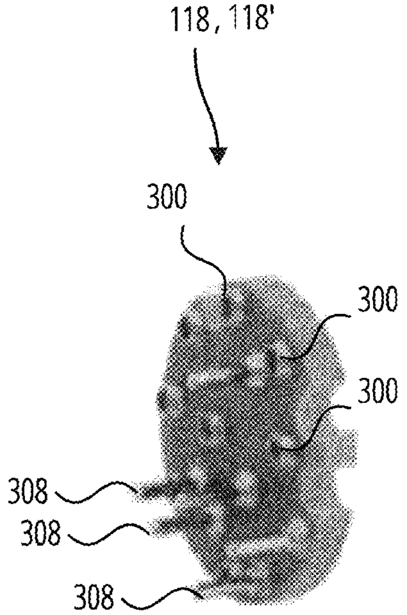
FIG. 6 is a perspective view generally illustrating an embodiment of a circuit board in accordance with teachings of the present disclosure.

With embodiments, a circuit board 118 may include one or more of a variety of shapes, sizes, configurations, and/or materials. As generally illustrated in FIGS. 4, 5, and 6, a circuit board 118 may include a generally circular and/or cylindrical configuration, such as if the first connector member 102 and/or the second connector member 104 include cylindrical configurations. A circuit board 118 may include one or more apertures 300 that may extend into and/or through (e.g., in an axial direction) the circuit board 118. The one or more apertures 300 may be configured to at least partially receive and/or electrically connect with the one or more first terminals 110 and/or the one or more second terminals 116. For example and without limitation, the apertures 300 may be configured as plated through holes (PTHs) that may be connected to respective traces 302 that may be disposed on the circuit board 118.

While embodiments of an electrical connector assembly 100 are disclosed with a circuit board 118 disposed in an axial configuration, an electrical connector assembly 100 may, additionally or alternatively, include a circuit board 118 with a radial configuration. A circuit board 118 may be disposed in a variety of locations within an electrical connector assembly 100.

In embodiments, such as generally illustrated in FIG. 4, an electrical connector assembly 100 may include an electrical characteristic sensor 304 and/or a temperature sensor 306 that may be connected to a circuit board 118. For example and without limitation, an electrical characteristic sensor 304 and/or a temperature sensor 306 may be disposed on and/or connected to a surface (e.g., an axial surface) of the circuit board 118. Additionally or alternatively, an electrical characteristic sensor 304 and/or a temperature sensor 306 may disposed in the electrical connector assembly 100 separately from the circuit board 118 and electrically connected thereto (e.g., via one or more conductors). The electrical characteristic sensor 304 may include one or more of a variety of shapes, sizes, and/or configurations. For example and without limitation, the electrical characteristic sensor 304 may include a current sensor (e.g., a Hall sensor, a shunt, etc.), a voltage sensor, a resistance sensor, and/or an impedance sensor, among others. The electrical characteristic sensor 304 may be configured to sense (e.g., detect, measure, monitor, obtain information regarding, etc.) a current of a cable (e.g., the first cable 202 and/or the second cable 206), and/or may be configured to sense one or more currents of individual conductors (e.g., the first conductors 204 and/or the second conductors 208).

With embodiments, such as generally illustrated in FIG. 6, a circuit board 118 may include one or more pins 308 that may extend from a surface of the circuit board 118, such as in a generally axial direction. The one or more pins 308 may, for example, be configured for connection with the first terminals 110 and/or the second terminals 116.

Figure 7:
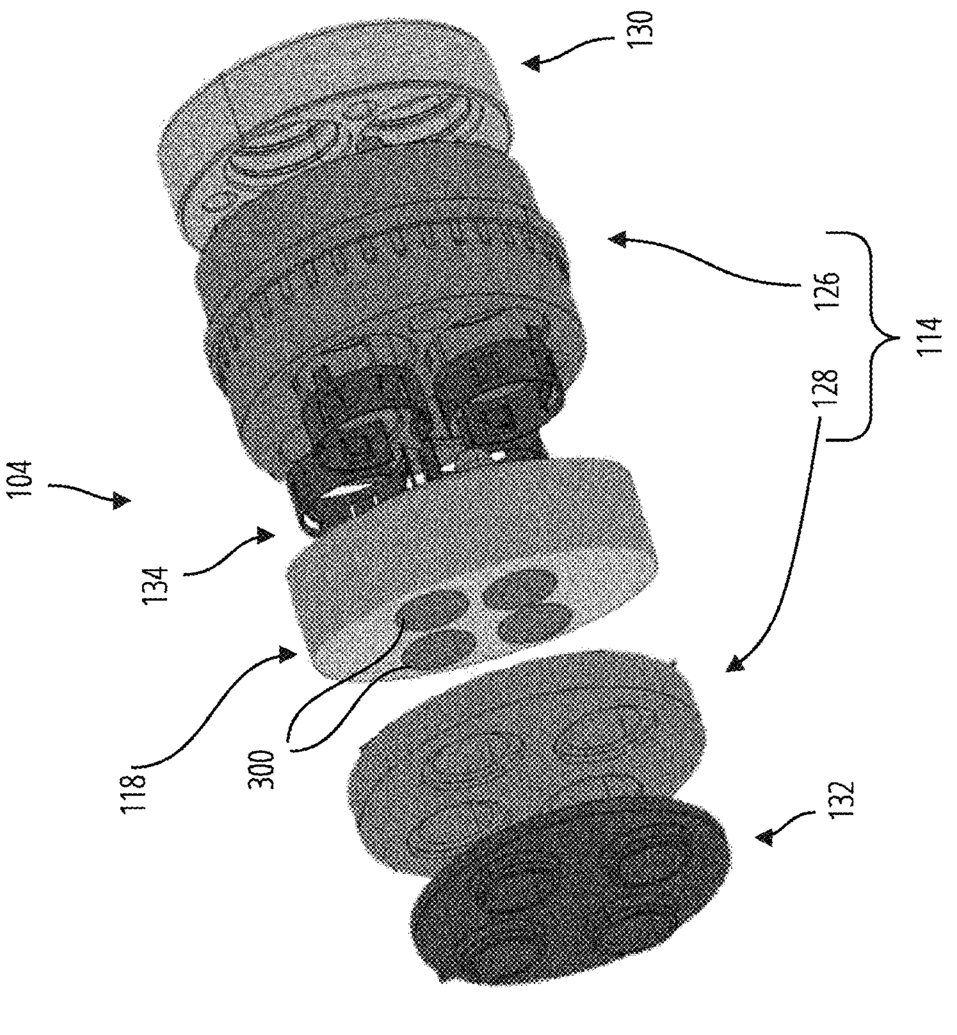
FIG. 7 is an exploded perspective view generally illustrating an embodiment of a second connector member in accordance with teachings of the present disclosure.

In embodiments, such as generally illustrated in FIG. 7, a second connector member 104 may include a circuit board 118 (e.g., in addition to and/or instead of a circuit board 118 of the first connector member 102). The second insulator 114 may include a first portion 126 and a second portion 128 that may be separate and/or spaced from each other, such as in an axial direction. The circuit board 118 may be disposed at least partially between (e.g., axially) the first portion 126 and the second portion 128. The second portion 128 may be disposed at least partially between the first portion 126 and the first insulator 108, such as in a connected configuration of the electrical connector assembly 100. For example and without limitation, the circuit board 118 and the second portion 128 may be disposed at least partially axially between the first insulator 108 and the first portion 126 of the second insulator 114.

In embodiments, a circuit board 118 may, for example and without limitation, be connected to a first insulator 108 and/or a second insulator 114 (or portions 120, 122, 126, 128 thereof) via an adhesive 214 (see, e.g., FIG. 2).

With embodiments, a second connector member 104 (and/or a first connector member 102) may include a grommet 130, a seal 132, and/or one or more retainers 134. The grommet 130 and the seal 132 may be disposed at opposite ends of the second connector member 104, which may include a second insulator 114 and/or a circuit board 118 being disposed axially between the grommet 130 and the seal 132. The grommet 130 may be configured for connection with the second cable 206 and/or the one or more second conductors 208, such as to retain and/or seal the second connector member 104 with the second cable 206. The seal 132 may be configured to engage a corresponding face or seal of another connector member (e.g., the first connector member 102). The grommet 130 and/or the seal 132 may, for example and without limitation, comprise silicone. The one or more retainers 134 may be configured for connection with and/or to retain the second terminals 116, which may be connected (e.g., soldered, crimped, etc.) with the second conductors 208.

Figure 8:
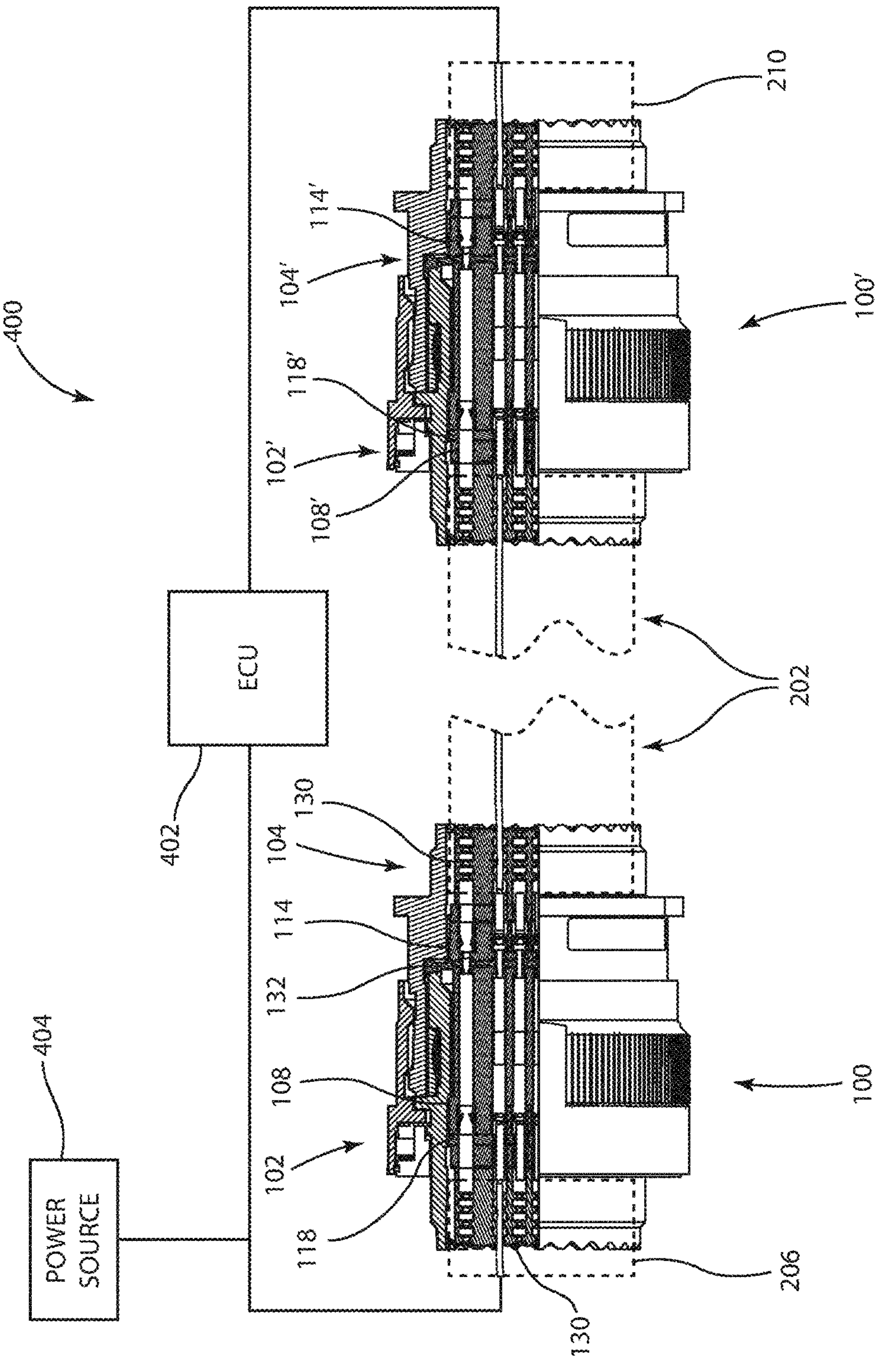
FIG. 8 is a partial cross-sectional view generally illustrating an embodiment of an electrical system in accordance with teachings of the present disclosure.

In embodiments, such as generally illustrated in FIG. 8, an electrical system 400 may include a first electrical connector assembly 100, a second electrical connector assembly 100', an electronic control unit (ECU) 402, a first cable 202, a second cable 206, and/or a third cable 210.

With embodiments, the second electrical connector assembly 100' may include the same or a similar configuration as the first electrical connector assembly 100. For example and without limitation, the second electrical connector assembly 100' may include a first connector member 102', a second connector member 104', a first insulator 108', a second insulator 114', and/or a circuit board 118'.

In embodiments, an ECU 402 may be connected (e.g., via wired and/or wireless connection) with the circuit board 118 and/or the circuit board 118'. For example and without limitation, the ECU 402 may be connected with an electrical characteristic sensor 304 and/or a temperature sensor 306 of the circuit board 118 via one or more of the first conductors 204, one or more first terminals 110, and/or one or more traces 302 of the circuit board 118. Additionally or alternatively, the ECU 402 may be connected with an electrical characteristic sensor 304 and/or a temperature sensor 306 of the circuit board 118' via one or more third conductors 212 of the third cable 210.

In embodiments, an electrical system 400 may be configured to detect and/or respond to one or more of a variety of errors. Responding to an error may, for example, include shutting down and/or disconnecting a component connected to the cable 202, 206 or conductor 204, 208 with the error. Errors may include, for example and without limitation, over/under voltage, over/under current, series/parallel arc faults, partial discharges, ground faults, and/or other faults. Errors in an electrical system 400 may be caused by one or more of a variety of issues, such as, for example, wire insulation vibration, chafing, aging, degradation, heat damage, delamination, cracking, and/or moisture penetration, among others. Errors may include a conductor 204, 208 being damaged or breaking, and the electrical system 400 may be configured to detect a corresponding increase in resistance of the cable 202, 206. Additionally or alternatively, errors may, in some circumstances, result in some electrical current being leaked to a ground (e.g., a vehicle/aircraft chassis ground). If the leakage current is sufficiently high, an arc or short may be created, which may damage one or more components of the electrical system 400 or systems connected or proximate the electrical system 400.

With embodiments, the ECU 402 may be configured to detect leakage current. For example and without limitation, the ECU 402 may obtain a first current via an electrical characteristic sensor 304 of a first electrical connector assembly 100 connected to a first end of a first cable 202, and obtain a second current via an electrical characteristic sensor 304 of a second electrical connector assembly 100' connected to a second end of the first cable 202. If the difference between the first current and the second current is not within a leakage current threshold, the ECU 402 may indicate an error has occurred, which may allow for the cable 202, 206 to be repaired or replaced before a potentially larger issue (e.g., arc, short, etc.) occurs. The leakage current threshold may depend, at least to some extent, on a temperature proximate the first cable 202 (e.g., a resistance of the first cable 202 may vary with temperature). The ECU 402 may select the leakage current threshold according, at least in part, to a first temperature sensed via a first temperature sensor 306 of the first electrical connector assembly 100 and/or a second temperature sensed via a second temperature sensor 306 of the second electrical connector assembly 100'.

In embodiments, a circuit board 118 and/or components connected thereto (e.g., an electrical characteristic sensor 304, a temperature sensor 306, etc.) may be electrically connected with the first terminals 110 and/or the second terminals 116. For example, the circuit board 118, the electrical characteristic sensor 304, and/or the temperature sensor 306 may be configured to draw power from and/or provide information/data to (e.g., via power line communication or "PLC") the conductors 204, 208 via the terminals 110, 116. The provided information/data may be transmitted via the conductors 204, 208 to the ECU 402, for example. The circuit board 118 may, for example, include one or more current loops 312 to facilitate connections between the circuit board 118, the electrical characteristic sensor 304, and/or the temperature sensor 306 for obtaining power and/or providing information (e.g., via high frequency and/or sensor signals).

In embodiments, an electrical system 400 may include and/or be connected to a power source 404, such as a battery. An electrical connector assembly 100 may be configured to monitor the power source 404 and provide information about the power source 404 (e.g., temperature, peak current, voltage, impedance, etc.) to the ECU 402 and/or a remote location, which may provide efficient battery monitoring. The electrical connector assembly 100 may, for example and without limitation, provide the information via one or more conductors 204, 208 of a cable 202, 206 that may also be utilized for providing power from the power source 404 to other components, such as via PLC.

Figure 9:
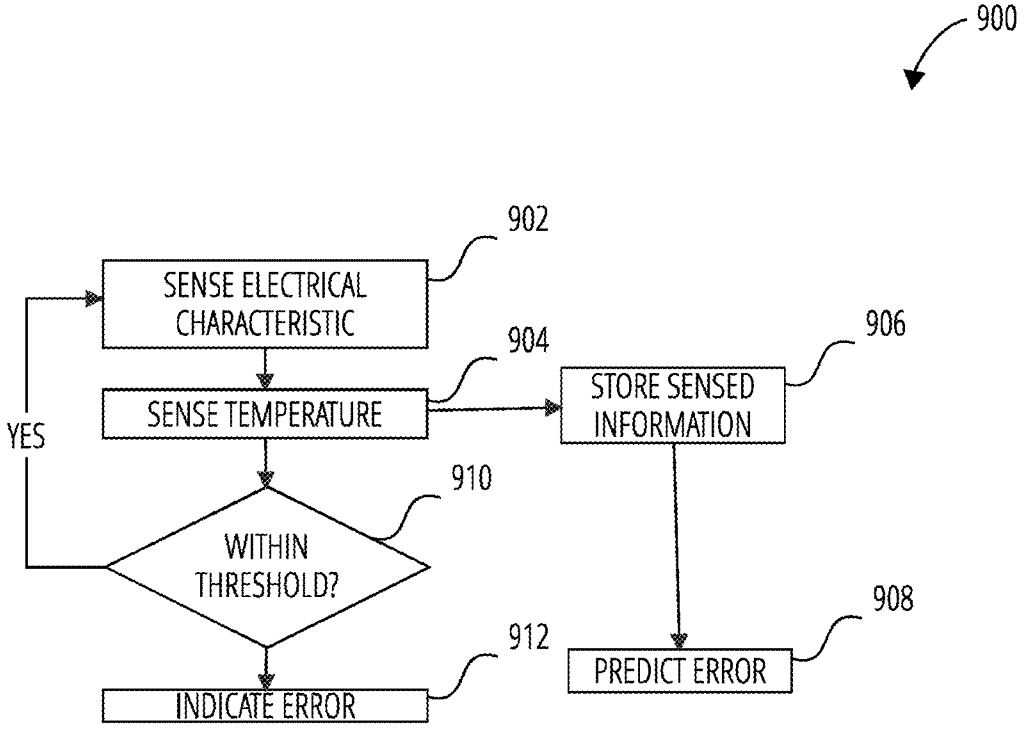
FIG. 9 is a flow chart generally illustrating an embodiment of a method of operating an electrical system in accordance with teachings of the present disclosure.

With embodiments, such as generally illustrated in FIG. 9, a method 900 of operating an electrical system 400 may include sensing an electrical characteristic (e.g., current, voltage, resistance, etc.) (block 902) and/or a temperature associated with one or more conductors (e.g., the first conductor 204) (block 904). The method 900 may include comparing the sensed electrical characteristic and/or the sensed temperature to a specified or predetermined range (block 910). The method 900 may include detecting and/or indicating an error if the sensed electrical characteristic and/or the sensed temperature is not within the specified or predetermined range (block 912). For example, if the ECU 402 determines that the electrical characteristic (e.g., a current) is outside a specified or predetermined range (e.g., below a minimum value of the predetermined range), the ECU 402 may determine that an error, such as excess leakage current, has occurred.

In embodiments, determining whether an electrical characteristic is within a specified or predetermined range (block 910) may include compensating for temperature variations, as the resistance of a conductor 204, 208 may vary with temperature. For example and without limitation, the ECU 402 may utilize both a sensed electrical characteristic and a sensed temperature to determine whether an error has occurred (blocks 910, 912).

With embodiments, an ECU 402 may be configured to detect an error (e.g., block 912) if a temperature sensed via the temperature sensor 306 (block 904), such as inside an electrical connector assembly 100, is not within a specified or predetermined temperature range (block 910). For example, if the first connector member 102 and the second connector member 104 are not properly connected, the improper connection may increase the temperature inside the electrical connector assembly 100, and if the improper connection is not detected, a corresponding poor electrical connection may lead to a connection failure. The ECU 402 may be configured to detect the connection error (e.g., via a temperature increase of a current transmitted through a smaller total cross-sectional area), which may allow for the connection to be repaired or replaced prior to failure.

In embodiments, an ECU 402 may be configured to detect an error and which conductor 204, 208 of a cable 202, 206 is associated with the error. In some circumstances, the electrical characteristic sensor 304 may be configured to sense (e.g., directly) electrical characteristics of each conductor 204, 208. Additionally or alternatively, the electrical characteristic sensor 304 may be configured to sense electrical characteristics of a cable 202, 206 as a whole, which may be less complex and/or less expensive than directly sensing electrical characteristics of each conductor 204, 208. The ECU 402 may be configured to identify the conductor(s) 204, 208 associated with an error even if the electrical characteristic sensor 304 is not configured for directly sensing each conductor 204, 208. For example and without limitation, an electrical connector assembly 100 may include one or more resistors 310 (see, e.g., FIG. 3). A respective resistor 310 may be electrically connected (e.g., in series) with some or all conductors 204, 208 of a cable 202, 206. The resistors 310 may, for example, each include a unique resistance and/or signature. The resistances and/or signatures of the resistors 310 may be provided to and/or stored in the ECU 402 such that in the event of an error with a particular conductor 204, 208 (e.g., a disconnection/open), the ECU 402 may utilize the stored resistance and/or signature to identify the conductor 204, 208 associated with the error. For example and without limitation, if a conductor 204, 208 is severed, the ECU 402 may detect a change in resistance or signature that may correspond to the unique resistance or signature of the conductor 204, 208, and the ECU 402 may identify that conductor 204, 208 as the severed conductor, which may facilitate efficient repair and/or replacement. In embodiments, determining whether sensed information is within a threshold (block 910) may include determining which conductor 204, 208 of a cable 202, 206 the sensed information corresponds to (e.g., which conductor 204, 208 has an error). With embodiments, sensing an electrical characteristic (block 902) may include applying optical time domain reflectometry (OTDR) for active health monitoring. OTDR may, for example, utilize the unique resistance and/or signature to identify conductors 204, 208.

With embodiments, the one or more resistors 310 may include one or more of a variety of shapes, sizes, configurations, and/or materials. For example and without limitation, a resistor 310 may be configured as a through-hole resistor, a surface mounted resistor (e.g., mounted to the circuit board 118), and/or a conductive material (e.g., copper) printed on a portion of a connector member 102, 104 (e.g., the first housing member 106 and/or the second housing member 112).

With embodiments, an ECU 402 may be configured to predict errors in an electrical system 400 (block 908), such as with an electrical connector assembly 100 and/or a cable 202, 206 connected thereto. For example and without limitation, the ECU 402 may be configured to monitor temperature, current, and/or leakage current over time, store the monitored/sensed information (block 906) and predict when a failure in the electrical system 400 is likely to occur (e.g., an expected failure time according to a rate of change) (block 908).

Embodiments of an electrical system 400 may allow for certain components to be omitted, such as external circuit breakers and/or circuit interrupters that might otherwise be separately connected to a cable 202, 206 or conductor 204, 208, as an electrical connector assembly 100 and/or an ECU 402 connected thereto may provide similar functionality. For example and without limitation, an electrical characteristic sensor 304 integrated with (e.g., without a separate housing) an electrical connector assembly 100 may provide current monitoring, which may allow for one or more external/central circuit breakers and/or interrupters to be omitted from the electrical system 400. Additionally or alternatively, the electrical system 400 may be configured to respond to errors more quickly than conventional circuit breakers and/or interrupters that may require a relatively significant buildup of heat before switching/disconnecting.

While some embodiments of electrical connector assemblies 100 and connector members 102, 104 are generally illustrated and described with one circuit board 118, other embodiments of electrical connector assemblies 100 and connector members 102, 104 may include more than one circuit board 118.

In examples, an ECU (e.g., ECU 402) may include an electronic controller and/or include an electronic processor, such as a programmable microprocessor and/or microcontroller. In embodiments, an ECU may include, for example, an application specific integrated circuit (ASIC). An ECU may include a central processing unit (CPU), a memory (e.g., a non-transitory computer-readable storage medium), and/or an input/output (I/O) interface. An ECU may be configured to perform various functions, including those described in greater detail herein, with appropriate programming instructions and/or code embodied in software, hardware, and/or other medium. In embodiments, an ECU may include a plurality of controllers. In embodiments, an ECU may be connected to a display, such as a touchscreen display.

Various examples/embodiments are described herein for various apparatuses, systems, and/or methods. Numerous specific details are set forth to provide a thorough understanding of the overall structure, function, manufacture, and use of the examples/embodiments as described in the specification and illustrated in the accompanying drawings. It will be understood by those skilled in the art, however, that the examples/embodiments may be practiced without such specific details. In other instances, well-known operations, components, and elements have not been described in detail so as not to obscure the examples/embodiments described in the specification. Those of ordinary skill in the art will understand that the examples/embodiments described and illustrated herein are non-limiting examples, and thus it can be appreciated that the specific structural and functional details disclosed herein may be representative and do not necessarily limit the scope of the embodiments.

Reference throughout the specification to "examples, "in examples," "with examples," "various embodiments," "with embodiments," "in embodiments," or "an embodiment," or the like, means that a particular feature, structure, or characteristic described in connection with the example/embodiment is included in at least one embodiment. Thus, appearances of the phrases "examples, "in examples," "with examples," "in various embodiments," "with embodiments," "in embodiments," or "an embodiment," or the like, in places throughout the specification are not necessarily all referring to the same embodiment. Furthermore, the particular features, structures, or characteristics may be combined in any suitable manner in one or more examples/embodiments. Thus, the particular features, structures, or characteristics illustrated or described in connection with one embodiment/example may be combined, in whole or in part, with the features, structures, functions, and/or characteristics of one or more other embodiments/examples without limitation given that such combination is not illogical or non-functional. Moreover, many modifications may be made to adapt a particular situation or material to the teachings of the present disclosure without departing from the scope thereof.

It should be understood that references to a single element are not necessarily so limited and may include one or more of such element. Any directional references (e.g., plus, minus, upper, lower, upward, downward, left, right, leftward, rightward, top, bottom, above, below, vertical, horizontal, clockwise, and counterclockwise) are only used for identification purposes to aid the reader's understanding of the present disclosure, and do not create limitations, particularly as to the position, orientation, or use of examples/embodiments.

Joinder references (e.g., attached, coupled, connected, and the like) are to be construed broadly and may include intermediate members between a connection of elements and relative movement between elements. As such, joinder references do not necessarily imply that two elements are directly connected/coupled and in fixed relation to each other. The use of "e.g." in the specification is to be construed broadly and is used to provide non-limiting examples of embodiments of the disclosure, and the disclosure is not limited to such examples. Uses of "and" and "or" are to be construed broadly (e.g., to be treated as "and/or"). For example and without limitation, uses of "and" do not necessarily require all elements or features listed, and uses of "or" are inclusive unless such a construction would be illogical.

While processes, systems, and methods may be described herein in connection with one or more steps in a particular sequence, it should be understood that such methods may be practiced with the steps in a different order, with certain steps performed simultaneously, with additional steps, and/or with certain described steps omitted.

All matter contained in the above description or shown in the accompanying drawings shall be interpreted as illustrative only and not limiting. Changes in detail or structure may be made without departing from the present disclosure.

It should be understood that an electronic control unit (ECU), a system, and/or a processor as described herein may include a conventional processing apparatus known in the art, which may be capable of executing preprogrammed instructions stored in an associated memory, all performing in accordance with the functionality described herein. To the extent that the methods described herein are embodied in software, the resulting software can be stored in an associated memory and can also constitute means for performing such methods. Such a system or processor may further be of the type having ROM, RAM, RAM and ROM, and/or a combination of non-volatile and volatile memory so that any software may be stored and yet allow storage and processing of dynamically produced data and/or signals.

It should be further understood that an article of manufacture in accordance with this disclosure may include a non-transitory computer-readable storage medium having a computer program encoded thereon for implementing logic and other functionality described herein. The computer program may include code to perform one or more of the methods disclosed herein. Such embodiments may be configured to execute via one or more processors, such as multiple processors that are integrated into a single system or are distributed over and connected together through a communications network, and the communications network may be wired and/or wireless. Code for implementing one or more of the features described in connection with one or more embodiments may, when executed by a processor, cause a plurality of transistors to change from a first state to a second state. A specific pattern of change (e.g., which transistors change state and which transistors do not), may be dictated, at least partially, by the logic and/or code.

What is claimed is:

1. An electrical connector assembly comprising:

a first connector including a first housing with a first end and a second end, the first housing extending axially between the first end and the second end of the first housing, the first connector also including a first insulator, a circuit board, and first terminals, the first terminals being electrically connected with first conductors of a first cable, the first conductors being routed into the first housing through the first end of the first housing and the first end of the first housing being sealed, the first housing surrounding the first insulator, the circuit board and the first terminals, the first insulator including a first portion and a second portion, the first and second portions of the first insulator supporting the first terminals with respect to each other, the first terminals extending axially through the circuit board and the first and second portions of the first insulator, wherein the circuit board is positioned axially between the first and second portions of the first insulator and defines a plurality of apertures through which the first terminals axially extend, wherein an electrical characteristic sensor is mounted on the circuit board, wherein the sensor is electrically connected to at least one of the first terminals by an electrical pathway that includes a trace on the circuit board, and wherein the electrical pathway directly electrically contacts the at least one of the first terminals;

a second connector including a second housing with a first end and a second end, the second housing extending axially between the first end and the second end of the second housing, the second connector also including a second insulator and second terminals, the second terminals being electrically connected with second conductors of a second cable, the second conductors being routed into the second housing through the first end of the second housing and the first end of the second housing being sealed, the second terminals extending axially through the second insulator, the second housing surrounding the second insulator and the second terminals; and wherein the second ends of the first and second housings are configured to be coupled together causing the first terminals and the second terminals to be electrically connected to each other, and wherein a seal provides sealing between the first and second connectors when the first and second housings are coupled together.

2. The electrical connector assembly of claim 1, wherein the electrical characteristic sensor includes a voltage sensor and/or a current sensor.

3. The electrical connector assembly of claim 1, wherein the circuit board includes a current loop.

4. The electrical connector assembly of claim 3, wherein the current loop is electrically connected to the first terminals to provide an electrical connection between each conductor connected to respective first terminals and the electrical characteristic sensor such that at least one conductor provides power to the electrical characteristic sensor.

5. The electrical connector assembly of claim 1, wherein the circuit board includes a temperature sensor.

6. The electrical connector assembly of claim 5, wherein the circuit board, the electrical characteristic sensor, and/or the temperature sensor may be configured to draw power from and/or provide information/data to the first conductors via the first terminals.

7. The electrical connector assembly of claim 1, wherein the circuit board is configured for electrical connection to at least one of the first conductors to provide power to the electrical characteristic sensor.

8. The electrical connector assembly of claim 1, wherein the circuit board is connected to the first insulator and the second insulator via an adhesive.

9. The electrical connector assembly of claim 1, wherein the plurality of apertures are plated through holes electrically connected with the trace.

10. The electrical connector assembly of claim 9, wherein the first terminals are disposed in the first insulator and the circuit board and extend through the plated through holes of the circuit board.

11. The electrical connector assembly of claim 1, wherein the circuit board includes pins configured to connect with the first and/or second terminals.

12. The electrical connector assembly of claim 1, wherein the second end of the first housing fits over the second end of the second housing.

13. The electrical connector assembly of claim 1, wherein an electronic control unit is connected with the circuit board, and wherein the electronic control unit is electrically connected with the electrical characteristic sensor and/or a temperature sensor of the circuit board via one or more first conductors, one or more first terminals, and/or one or more traces of the circuit board.

14. The electrical connector assembly of claim 1, wherein the first housing and the second housing are cylindrical housings.

15. The electrical connector assembly of claim 1, the first housing including a first grommet sealing the first end of the first housing; where the second housing including a second grommet sealing the first end of the second housing, and wherein each of the first and second grommets include a plurality of apertures for receiving respective first and second conductors of the first and second connectors.

16. The electrical connector assembly of claim 15, wherein the second connector includes a circuit board.

17. The electrical connector assembly of claim 16, wherein the first and second grommets, the first and second insulators, and the circuit boards are cylindrical.

18. The electrical connector assembly of claim 16, wherein the second insulator includes a first portion and a second portion.

19. The electrical connector assembly of claim 18, wherein the circuit board of the second connector is positioned axially between the first and second portions of the second insulator and defines a plurality of apertures extending axially through the circuit board of the second connector.

20. An electrical connector assembly comprising:

a first connector including a first housing with a first end and a second end, the first housing extending axially between the first end and the second end of the first housing, the first connector also including a first insulator, a circuit board and first terminals, the first terminals being electrically connected with first conductors of a first cable, the first conductors being routed into the first housing through the first end of the first housing and the first end of the first housing being sealed, the first housing surrounding the first insulator, the circuit board and the first terminals, the first insulator including a first portion and a second portion, the first and second portions of the first insulator supporting the first terminals in spaced-apart, parallel relation with respect to each other, the first terminals extending axially through the circuit board and the first and second portions of the first insulator, wherein the circuit board is positioned axially between the first and second portions of the first insulator and defines a plurality of apertures extending axially through the circuit board, wherein the plurality of apertures includes plated through holes that receive and electrically connect with the first terminals, wherein an electrical characteristic sensor is mounted on the circuit board, wherein the electrical characteristic sensor is electrically connected to the plated through holes by traces on the circuit board, and wherein the first terminals electrically connect with the electrical characteristic sensor by the traces and the plated through holes such that the first conductors electrically connect with the electrical characteristic sensor;

a second connector including a second housing with a first end and a second end, the second housing extending axially between the first end and the second end of the second housing, the second connector also including a second insulator and second terminals, the second terminals being electrically connected with second conductors of a second cable, the second conductors being routed into the second housing through the first end of the second housing and the first end of the second housing being sealed, the second terminals extending axially through the second insulator and being supported in parallel spaced-part relation relative to each other by the second housing, the second housing surrounding the second insulator and the second terminals; and wherein the second ends of the first and second housings are configured to be coupled together causing the first terminals and the second terminals to be electrically connected to each other, and wherein a seal provides sealing between the first and second connectors when the first and second housing are coupled together.

* * * * *